(12) United States Patent
Yamamoto et al.

(10) Patent No.: US 11,800,671 B2
(45) Date of Patent: Oct. 24, 2023

(54) MOTOR DRIVE DEVICE

(71) Applicant: Mitsubishi Electric Corporation, Tokyo (JP)

(72) Inventors: Hideaki Yamamoto, Tokyo (JP); Toshio Nakayama, Tokyo (JP); Akihiro Gonda, Tokyo (JP); Nichika Moriguchi, Tokyo (JP); Yorimasa Yasuda, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 18/030,282

(22) PCT Filed: Feb. 12, 2021

(86) PCT No.: PCT/JP2021/005360
§ 371 (c)(1),
(2) Date: Apr. 5, 2023

(87) PCT Pub. No.: WO2022/172420
PCT Pub. Date: Aug. 18, 2022

(65) Prior Publication Data
US 2023/0276590 A1    Aug. 31, 2023

(51) Int. Cl.
*H05K 5/03* (2006.01)
*H05K 5/02* (2006.01)
*H02K 11/33* (2016.01)

(52) U.S. Cl.
CPC .............. *H05K 5/03* (2013.01); *H02K 11/33* (2016.01); *H05K 5/0226* (2013.01)

(58) Field of Classification Search
CPC ....... H05K 5/03; H05K 5/0226; G06F 1/1681
See application file for complete search history.

(56) References Cited

U.S. PATENT DOCUMENTS 6,463,774 B2 * 10/2002 Sokurenko ............ E05B 13/105
                                                            70/370
7,675,753 B2 *  3/2010 Li ............................ G06F 1/183
                                                            165/185
(Continued)

FOREIGN PATENT DOCUMENTS

JP    2001-054212 A    2/2001
JP    2005-129770 A    5/2005
(Continued)

OTHER PUBLICATIONS

International Search Report and Written Opinion dated Apr. 13, 2021, received for PCT Application PCT/JP2021/005360, filed on Feb. 12, 2021, 12 pages including English Translation.
(Continued)

*Primary Examiner* — Rockshana D Chowdhury
*Assistant Examiner* — Douglas R Burtner
(74) *Attorney, Agent, or Firm* — XSENSUS LLP

(57) ABSTRACT

A motor drive device includes a case including a first surface and a housing portion that opens to the first surface side, a terminal block including a terminal to which an electric wire extending to an outside of the case is connectable and being housed in the housing portion, an openable and closable cover covering the opening, and a lock unit restricting opening and closing of the cover and bringing the cover into a locked state in a state where the cover is closed. The lock unit is provided on the cover to be rotatable about an axis perpendicular to the first surface in a state where the cover is closed. An unlocked state in which the cover is openable and the locked state are switched according to rotation angle of the lock unit. The lock unit includes a state indicator indicating that the cover is in the locked state.

10 Claims, 14 Drawing Sheets

(56) References Cited

U.S. PATENT DOCUMENTS

| | | | | |
|---|---|---|---|---|
| 7,695,031 | B2* | 4/2010 | Jackson, Jr. | E05C 5/00 292/65 |
| 7,780,203 | B2* | 8/2010 | Jan | E05C 19/022 292/19 |
| 7,789,437 | B2* | 9/2010 | Sheng | G06F 1/1658 292/145 |
| 7,815,227 | B2* | 10/2010 | Jan | H05K 5/0221 292/DIG. 37 |
| 8,756,963 | B2* | 6/2014 | Le | E05C 1/14 292/DIG. 37 |
| 8,814,225 | B2* | 8/2014 | Yang | H05K 5/0221 292/57 |
| 8,934,224 | B2* | 1/2015 | Iwamoto | G06F 1/1616 439/153 |
| 9,282,659 | B2* | 3/2016 | Lee | H05K 5/03 |
| 9,317,077 | B2* | 4/2016 | Mori | G06F 1/1616 |
| 9,529,392 | B2* | 12/2016 | Lee | G06F 1/1656 |
| 9,560,782 | B2* | 1/2017 | Lee | H05K 5/068 |
| 10,314,188 | B2* | 6/2019 | Nihei | H01R 13/6271 |
| 10,490,041 | B1* | 11/2019 | Churak | H05K 5/03 |
| 10,886,660 | B2* | 1/2021 | Hoshika | G06F 1/1616 |
| 10,990,135 | B2* | 4/2021 | Joo | G06F 1/1613 |
| 2009/0094808 | A1* | 4/2009 | Jan | E05C 19/022 24/601.1 |
| 2009/0184523 | A1* | 7/2009 | Li | E05C 19/022 292/139 |
| 2011/0211300 | A1* | 9/2011 | Mori | G06F 1/1681 361/679.01 |
| 2013/0044420 | A1* | 2/2013 | Iwamoto | G06F 1/1656 361/679.01 |
| 2014/0085784 | A1* | 3/2014 | Lee | G06F 1/1633 361/679.01 |
| 2014/0170871 | A1* | 6/2014 | Wu | H01R 13/447 439/131 |
| 2015/0212554 | A1* | 7/2015 | Mori | G06F 1/1681 361/679.55 |
| 2016/0143164 | A1 | 5/2016 | Wang et al. | |
| 2019/0258299 | A1* | 8/2019 | Joo | H05K 5/0226 |

FOREIGN PATENT DOCUMENTS

| | | |
|---|---|---|
| JP | 2005-294514 A | 10/2005 |
| JP | 2007-033316 A | 2/2007 |
| JP | 2008-010599 A | 1/2008 |
| JP | 2019-145789 A | 8/2019 |

OTHER PUBLICATIONS

Notice of Reason for Refusal dated Feb. 22, 2022, received for JP Application 2021-570531, 13 pages Including English Translation.
Decision to Grant dated Jun. 21, 2022, received for JP Application 2021-570531, 12 pages including English Translation.

* cited by examiner

MOTOR DRIVE DEVICE

CROSS-REFERENCE TO RELATED APPLICATION

The present application is based on PCT filing PCT/JP2021/005360, filed Feb. 12, 2021, the entire contents of which are incorporated herein by reference.

FIELD

The present disclosure relates to a motor drive device including an openable and closable cover.

BACKGROUND

In a motor drive device installed on a control panel, a terminal block to which an electric wire is connectable is provided on the front surface. Further, the motor drive device is provided with an openable and closable cover that covers the terminal block. By closing the cover, accidental contact with the terminal block can be prevented. Patent Literature 1 discloses a configuration including a locking mechanism that can be brought into a locked state in which a cover is restricted to a closed state. By providing the locking mechanism, it is possible to prevent the cover from opening unexpectedly and allowing contact with the terminal block, and prevent accidental contact with the terminal block.

CITATION LIST

Patent Literature

Patent Literature 1: Japanese Patent Application Laid-open No. 2019-145789

SUMMARY

Technical Problem

However, according to the above-described conventional technique, although the cover can be locked, there is no indication of a locked state, and it is difficult to visually determine whether the cover is in the locked state or an unlocked state. Accordingly, even though the cover is in the unlocked state, the user may misunderstand that the cover is in the locked state and forget to lock the cover, and thus the cover may be unexpectedly opened and allow accidental contact with the terminal block.

The present disclosure has been made in view of the above, and an object thereof is to provide a motor drive device that allows easily determining whether a cover covering a terminal block is in a locked state or an unlocked state.

Solution to Problem

In order to solve the above-described problems and achieve the object, a motor drive device according to the present disclosure includes a case including a first surface and a housing portion that opens to the first surface side; a terminal block including a terminal to which an electric wire extending to an outside of the case is connectable, the terminal block being housed in the housing portion; a cover to cover the opening, the cover being provided to be openable and closable; and a lock unit to restrict opening and closing of the cover and bring the cover into a locked state in a state where the cover is closed. The lock unit is provided on the cover so as to be rotatable about an axis perpendicular to the first surface in a state where the cover is closed. An unlocked state in which the cover is openable and the locked state are switched according to a rotation angle of the lock unit. The lock unit includes a state indicator to indicate that the cover is in the locked state.

Advantageous Effects of Invention

A motor drive device according to the present disclosure has an effect of easily determining whether a cover covering a terminal block is in a locked state or an unlocked state.

DESCRIPTION OF EMBODIMENTS

Hereinafter, a motor drive device according to embodiments of the present disclosure will be described in detail with reference to the drawings. Note that the present invention is not limited by the embodiments.

First Embodiment

Figure 1:
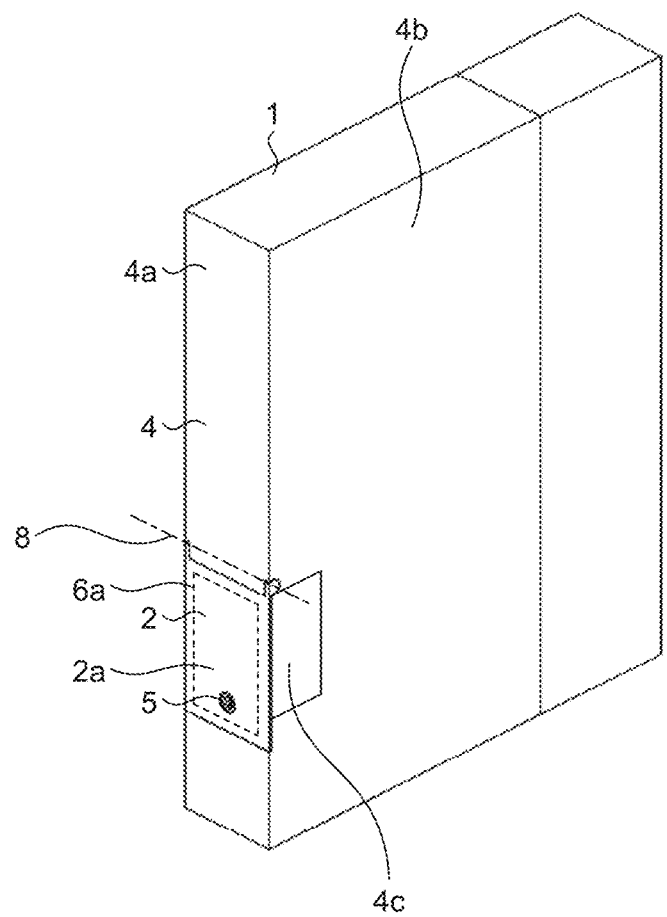
FIG. 1 is a perspective view of a motor drive device according to a first embodiment of the present disclosure.
Figure 2:
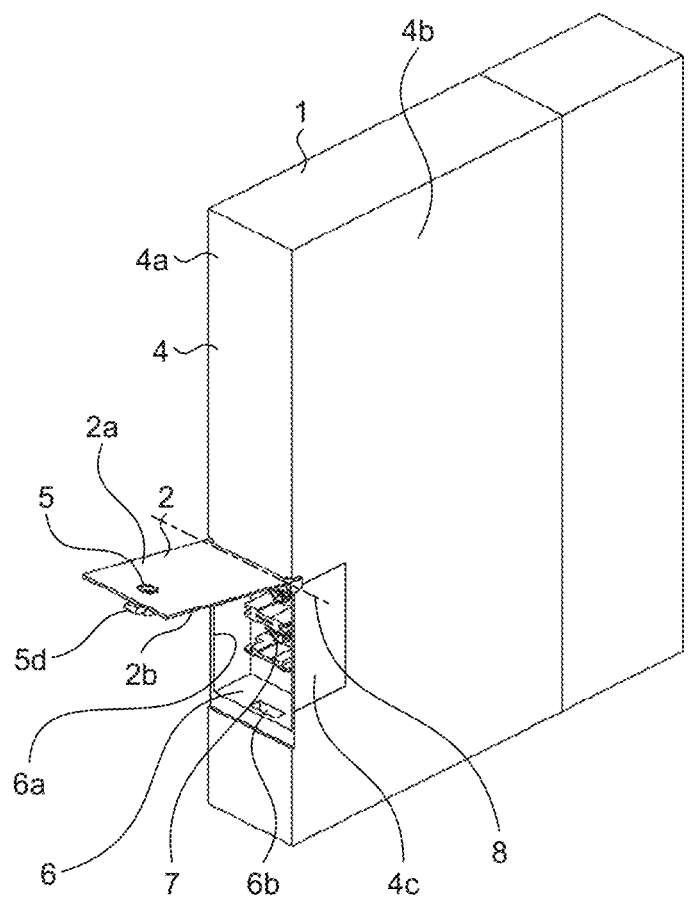
FIG. 2 is a perspective view of the motor drive device according to the first embodiment of the present disclosure.

FIGS. 1 and 2 are perspective views of a motor drive device according to a first embodiment of the present disclosure. FIG. 1 illustrates a state in which a cover described later is closed to cover an opening. FIG. 2 illustrates a state in which a cover described later is opened and the opening is not closed. A motor drive device 1 controls a servo motor. Specifically, the motor drive device 1 receives a command from a controller, supplies power to the servo motor, and causes the servo motor to perform an operation according to the command. Note that illustration of the controller and the servo motor is omitted.

The motor drive device 1 includes a case 4 having a rectangular parallelepiped shape. As illustrated in FIG. 2, the case 4 has a housing portion 6 recessed into a first surface 4a. The housing portion 6 is a space provided with an opening 6a on the first surface 4a side.

Figure 3:
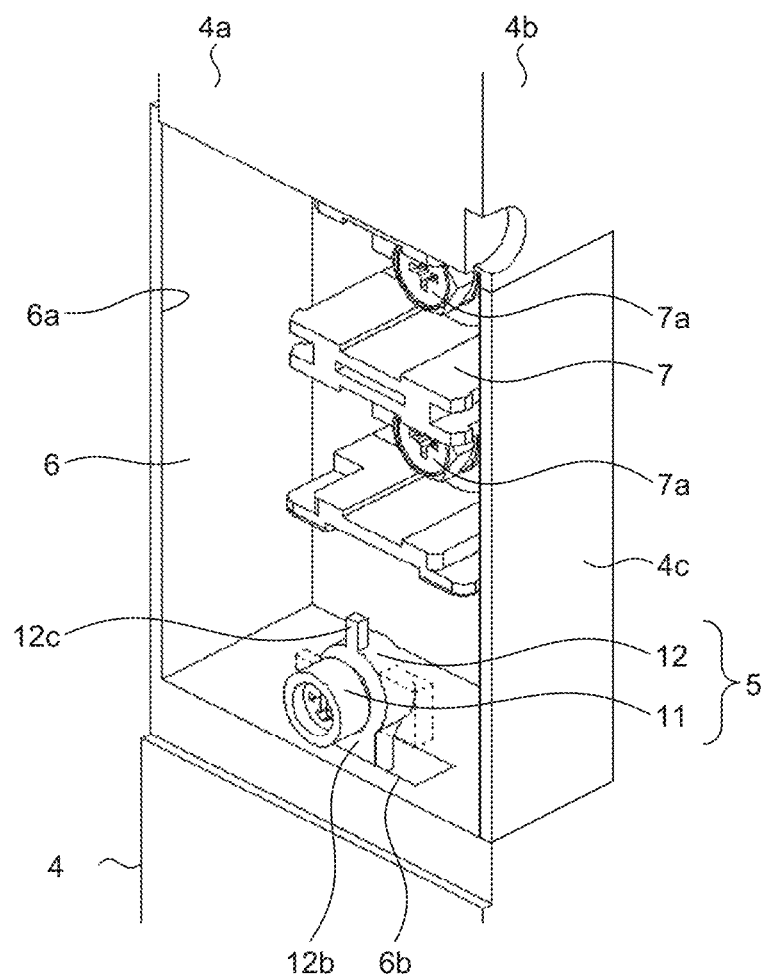
FIG. 3 is a partially enlarged perspective view in which a housing portion according to the first embodiment is enlarged.

FIG. 3 is a partially enlarged perspective view in which the housing portion according to the first embodiment is enlarged. An insertion trench 6b is formed in a wall surface of the housing portion 6. A first protrusion formed in a lock unit described later is inserted into the insertion trench 6b. A terminal block 7 is provided in the housing portion 6. The terminal block 7 is provided with a plurality of terminals 7a. One end of an electric wire can be connected to each of the terminals 7a. The other end of the electric wire connected to the terminal 7a extends, for example, to the outside of the case 4 and is connected to the servo motor. Power is supplied from the motor drive device 1 to the servo motor through the terminal 7a and the electric wire.

The motor drive device 1 includes a cover 2 that covers the opening 6a of the housing portion 6. As illustrated in FIG. 2, the cover 2 is attached to the case 4 so as to be rotatable about a rotation axis 8. The rotation axis 8 is an axis extending in a direction parallel to the first surface 4a. The opening 6a can be opened and closed by rotating the cover 2 about the rotation axis 8. That is, by rotating the cover 2 about the rotation axis 8, switching is made between a state in which the opening 6a is closed as illustrated in FIG. 1 and a state in which the opening 6a is not closed as illustrated in FIG. 2. In the following description, a surface of the cover 2 facing the same direction as the first surface 4a in a state where the cover 2 is closed is referred to as a front surface 2a. Further, a surface of the cover 2 facing the terminal block 7 in a state where the cover 2 is closed is referred to as a back surface 2b.

A part of a second surface 4b adjacent to the first surface 4a of the case 4 and constituting a part of the wall surface of the housing portion 6 is a detachable wall 4c detachable from the case 4. By detaching the detachable wall 4c, the electric wire connected to the terminal 7a can be pulled out to the outside of the housing portion 6 even in a state where the opening 6a is closed by the cover 2.

Figure 4:
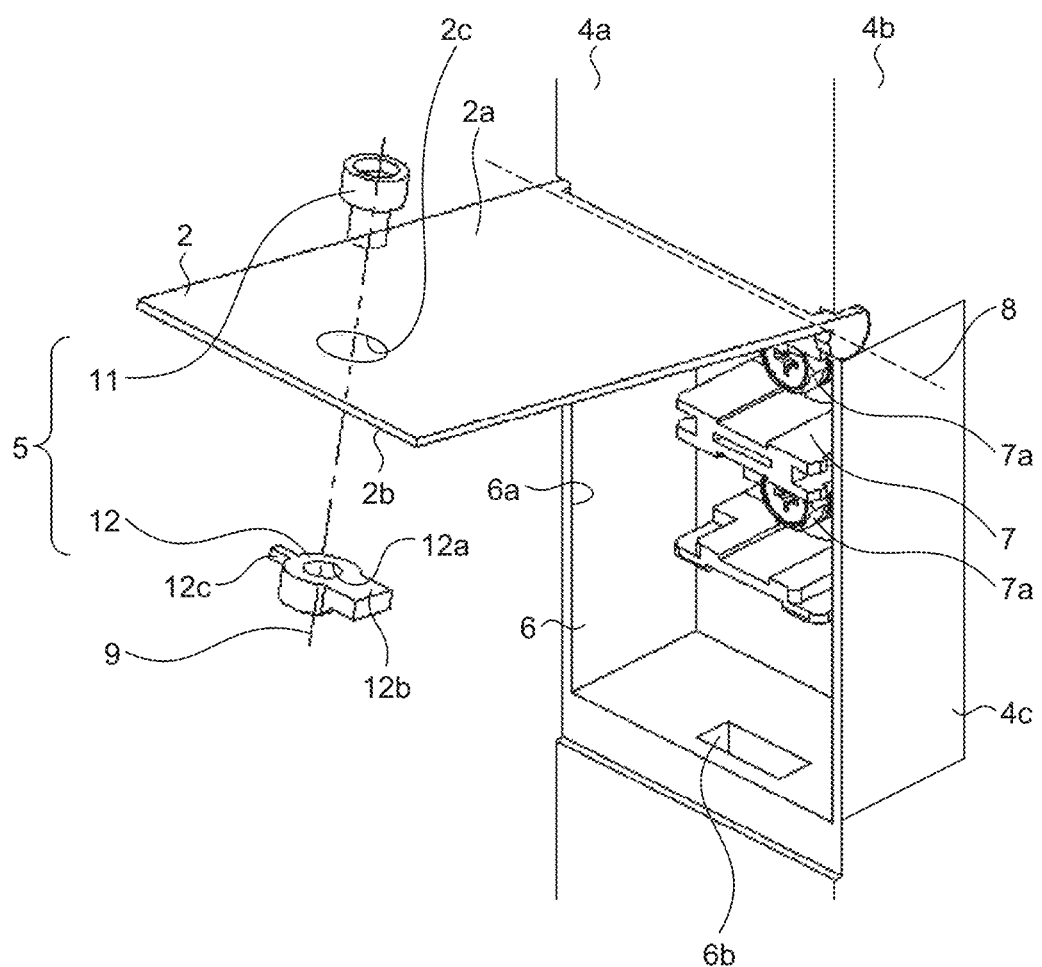
FIG. 4 is a partially enlarged perspective view of the housing portion according to the first embodiment in a state where a lock unit is disassembled.
Figure 5:
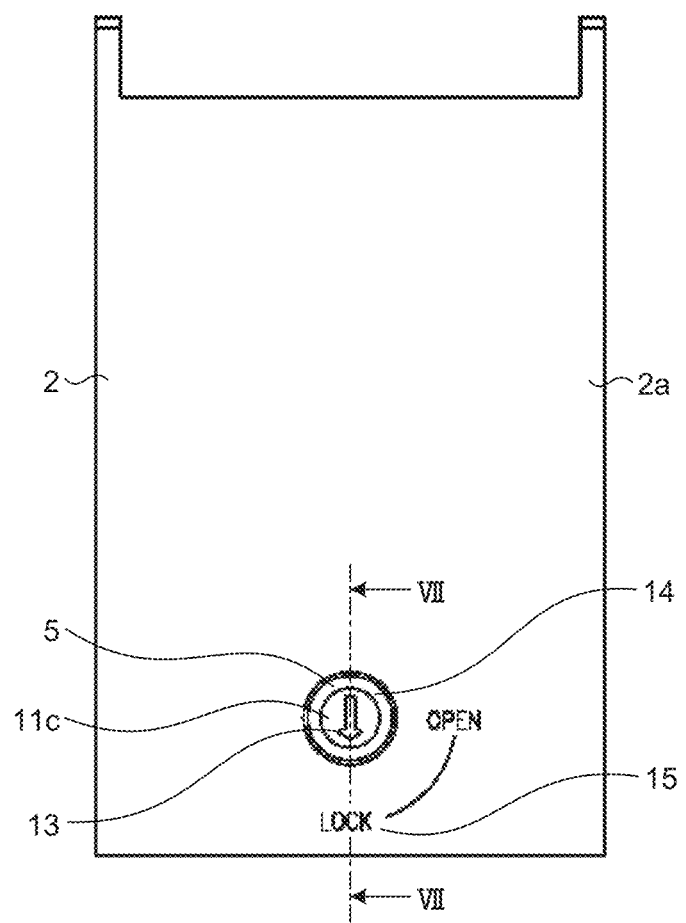
FIG. 5 is a view of the cover according to the first embodiment as viewed from a front side of a case.
Figure 6:
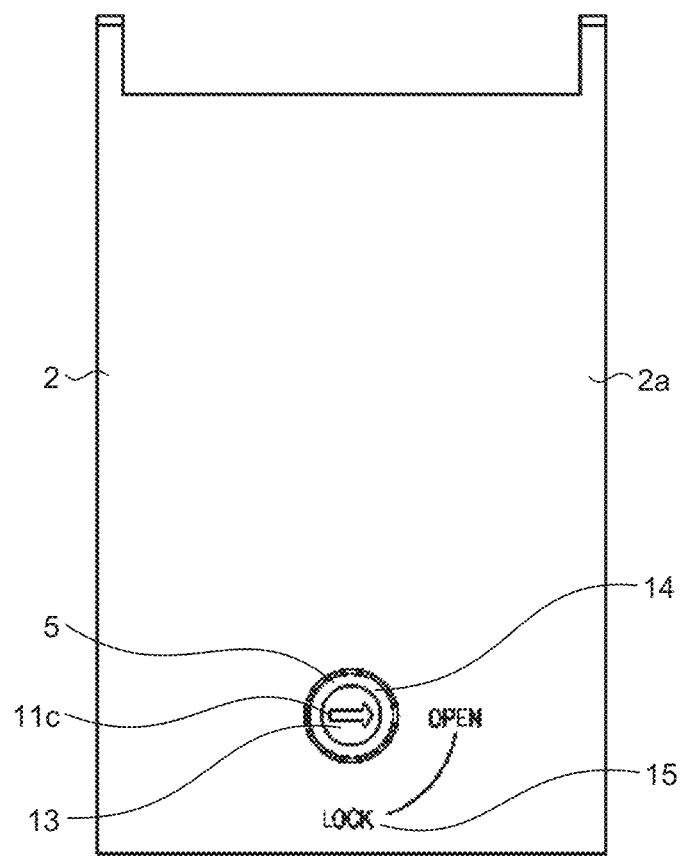
FIG. 6 is a view of the cover according to the first embodiment as viewed from the front side of the case.
Figure 7:
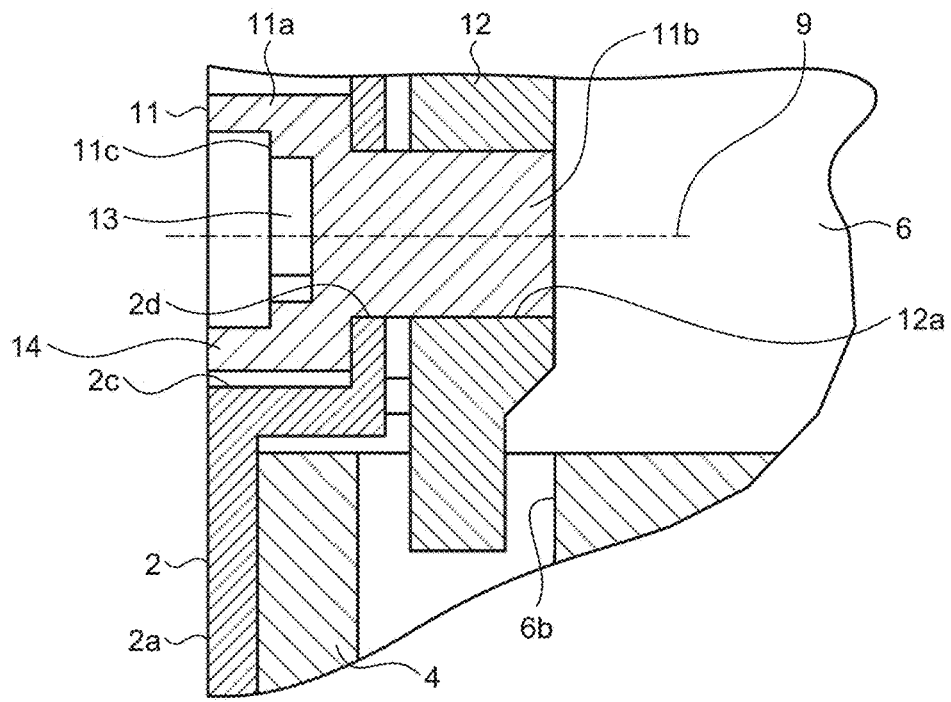
FIG. 7 is a cross-sectional view taken along line VII-VII illustrated in FIG. 5.
Figure 8:
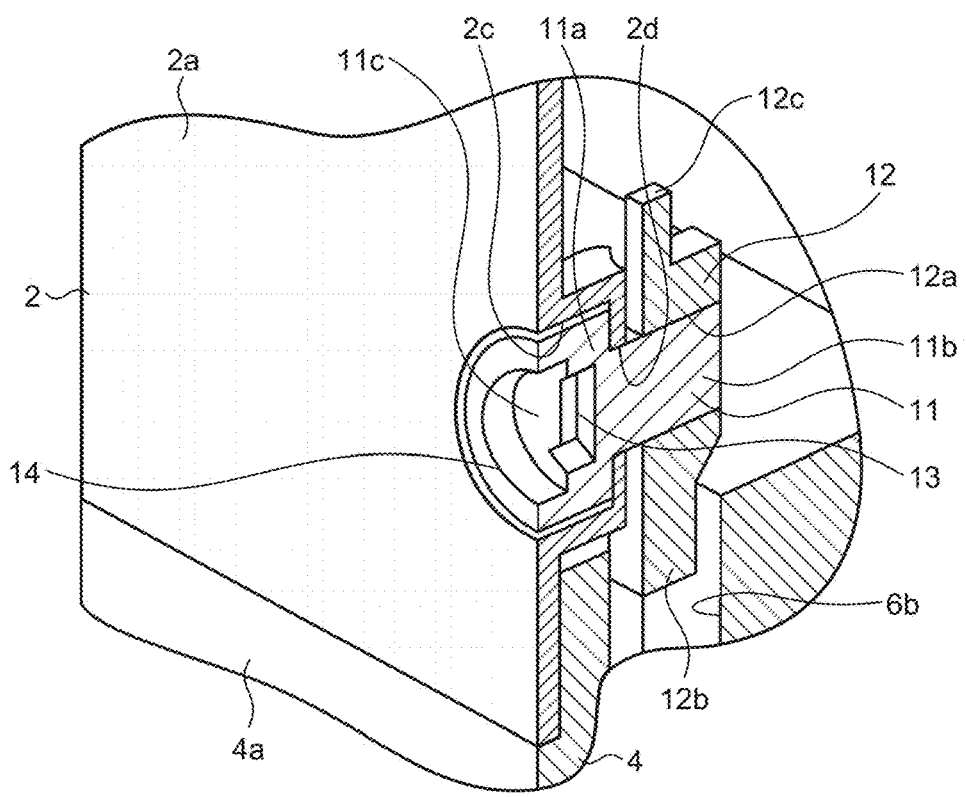
FIG. 8 is a perspective cross-sectional view of the cross section illustrated in FIG. 7 as viewed obliquely.

The motor drive device 1 includes a lock unit 5 to restrict opening and closing of the cover 2 and bring the cover 2 into a locked state in a state where the cover 2 is closed. FIG. 4 is a partially enlarged perspective view of the housing portion according to the first embodiment in a state where the lock unit is disassembled. FIGS. 5 and 6 are views of the cover according to the first embodiment as viewed from the front side of the case. In FIG. 5, the cover 2 is in a locked state. In FIG. 6, the cover 2 is in an unlocked state in which the cover 2 can be opened. FIG. 7 is a cross-sectional view taken along line VII-VII illustrated in FIG. 5. FIG. 8 is a perspective cross-sectional view of the cross section illustrated in FIG. 7 as viewed obliquely.

The lock unit 5 is provided on the cover 2 so as to be rotatable about a rotation axis 9. The rotation axis 9 is an axis extending in a direction perpendicular to the first surface 4a in a state where the cover 2 is closed. A hole 2c for attaching the lock unit 5 is formed in the cover 2. The hole 2c formed in the cover 2 is formed by recessing the front surface 2a of the cover 2. A through hole 2d having a diameter smaller than the diameter of the hole 2c is formed in the bottom surface of the hole 2c.

The lock unit 5 includes a first member 11 and a second member 12. The first member 11 is inserted into the hole 2c from the front surface 2a side of the cover 2. The second member 12 is provided on the back surface 2b side of the cover 2 and is connected to the first member 11.

The first member 11 has a bolt shape and includes a head portion 11a and a shaft portion 11b. The head portion 11a is formed to have a diameter that can be inserted into the hole 2c but cannot be inserted into the through hole 2d. The shaft portion 11b is formed to have a diameter that can be inserted into the through hole 2d.

A fitting hole 12a into which the shaft portion 11b of the first member 11 is fitted is formed in the second member 12. The second member 12 is a back surface protruding portion protruding to the back surface 2b side of the cover 2 in a state where the shaft portion 11b of the first member 11 is fitted into the fitting hole 12a. The second member 12 is formed with a first protrusion 12b extending in a direction perpendicular to the direction from the front surface 2a toward the back surface 2b. The second member 12 is formed with a second protrusion 12c extending in a direction perpendicular to the direction from the front surface 2a toward the back surface 2b at a position different from that of the first protrusion 12b. The first protrusion 12b is inserted into the insertion trench 6b formed in the housing portion 6 when the cover 2 is in the locked state.

The hole 2c formed in the cover 2 and the head portion 11a of the first member 11 have a circular shape when viewed along the rotation axis 9, and the first member 11 is rotatable about the rotation axis 9. Further, the second member 12 to which the shaft portion 11b of the first member 11 is fitted also rotates about the rotation axis 9 together with the first member 11. That is, the entire lock unit 5 is rotatable about the rotation axis 9. Note that the shape of the head portion 11a viewed along the rotation axis 9 is not limited to a circular shape, and may be a polygonal shape or an elliptical shape.

A trench 13 is formed in an operation surface 11c of the head portion 11a of the first member 11 exposed to the front surface 2a side of the cover 2. In the first embodiment, the operation surface 11c is a surface facing the same direction as the front surface 2a of the cover 2. The trench 13 is formed in a shape into which a tool such as a flathead screwdriver can be inserted. Further, the trench 13 is formed in a shape pointing in a specific direction. For example, as illustrated in FIGS. 5 and 6, the trench 13 is formed in an arrow shape. The arrow shape is formed by combining a rectangle and a triangle, and the rectangular portion is a portion into which a tool is inserted. The trench 13 is a state indicator that indicates whether the cover 2 is in the unlocked state or the locked state. A surrounding wall 14 surrounding the periphery of the trench 13 and protruding from the operation surface 11c is formed on the head portion 11a of the first member 11. The surrounding wall 14 is formed with a height that does not protrude from the front surface 2a of the cover 2. Note that the operation surface 11c may be inclined with respect to the front surface 2a of the cover 2.

As illustrated in FIGS. 5 and 6, the rotation angle of the lock unit 5 can be changed by inserting a tool into the trench 13 and rotating the tool. By changing the rotation angle of the lock unit 5 to change the position of the first protrusion 12b of the lock unit 5, the cover 2 is switched between the locked state and the unlocked state. Further, by changing the rotation angle of the lock unit 5, the direction in which the trench 13 formed in the lock unit 5 points is also changed.

On the front surface 2a of the cover 2, a locking indication indicating the locked state is provided at a position in the direction that the trench 13 in the locked state points. For example, as illustrated in FIGS. 5 and 6, "LOCK" is written as the locking indication indicating the locked state. On the front surface 2a of the cover 2, an unlocking indication indicating the unlocked state is provided at a position in the direction that the trench 13 in the unlocked state points. For example, as illustrated in FIGS. 5 and 6, "OPEN" is written as the unlocking indication indicating the unlocked state. The indication "LOCK" and the indication "OPEN" are an indication portion 15 that indicates whether the cover 2 is in the locked state or the unlocked state. The indication in the indication portion 15 may be any indication as long as it allows determining whether the cover 2 is in the locked state or the unlocked state, and is not limited to the indications "LOCK" and "OPEN".

Since the indication portion 15 is provided at the positions in the directions in which the trench 13 points, it is possible to easily visually determine whether the cover 2 is in the locked state or the unlocked state by checking the direction in which the trench 13 points. Note that, if at least the indication indicating the locked state is provided, it is possible to easily determine visually that the cover 2 is in the locked state.

Figure 9:
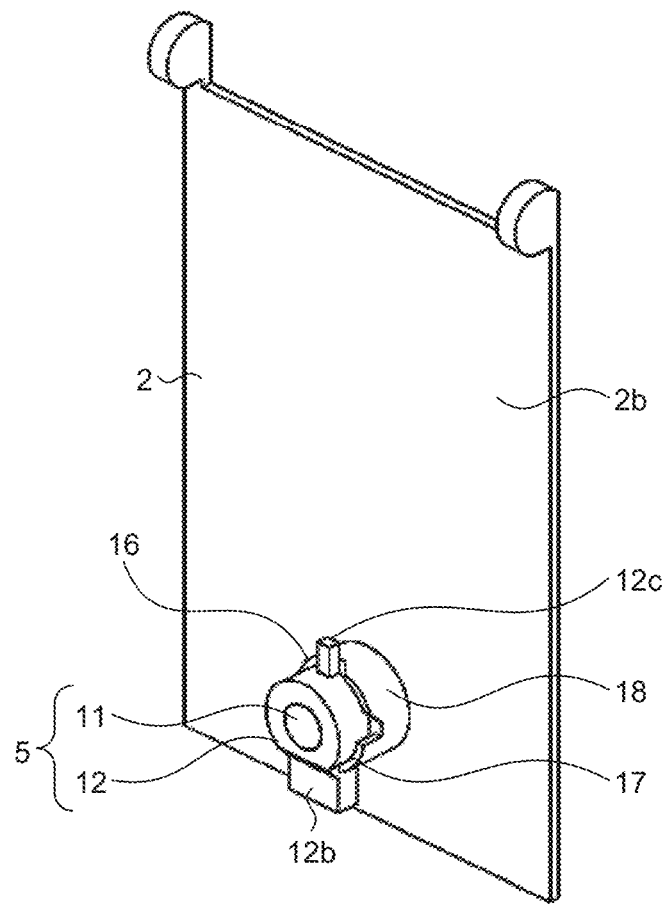
FIG. 9 is a perspective view of the cover according to the first embodiment as viewed from a back surface.
Figure 10:
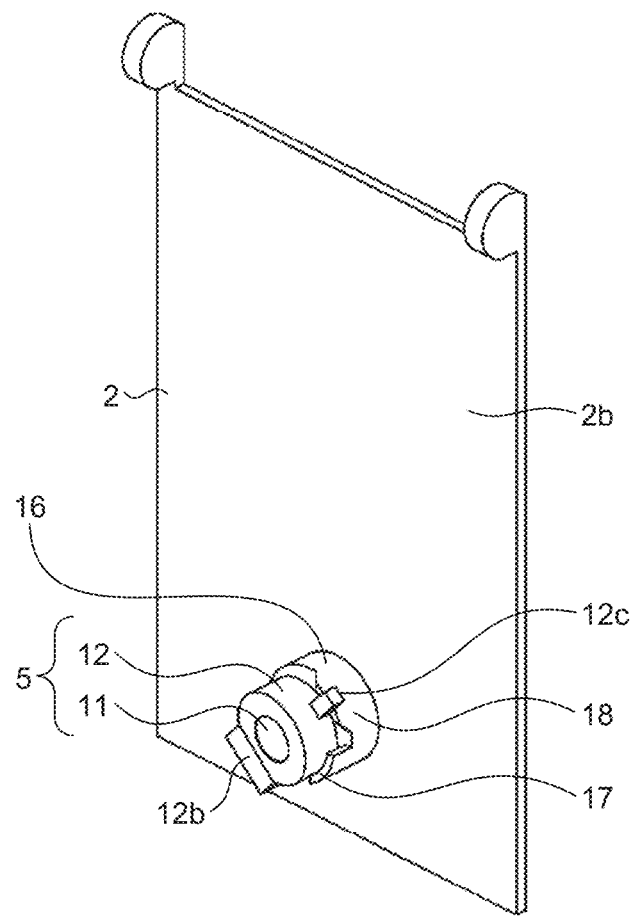
FIG. 10 is a perspective view of the cover according to the first embodiment as viewed from the back surface.
Figure 11:
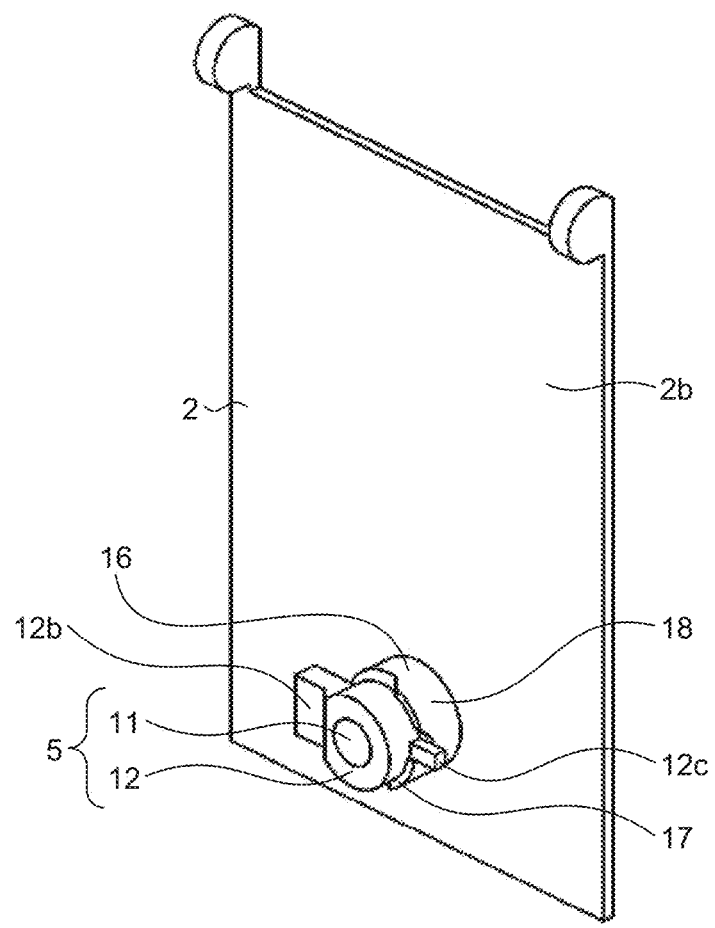
FIG. 11 is a perspective view of the cover according to the first embodiment as viewed from the back surface.

FIGS. 9 to 11 are perspective views of the cover according to the first embodiment as viewed from the back surface. FIG. 9 illustrates a case where the cover 2 is in the locked state, FIG. 10 illustrates a case where the cover 2 is in the process of changing from the locked state to the unlocked state, and FIG. 11 illustrates a case where the cover 2 is in the unlocked state.

In the locked state illustrated in FIG. 9, the first protrusion 12b of the lock unit 5 is inserted into the insertion trench 6b formed in the housing portion 6. In this state, the cover 2 cannot be opened because the first protrusion 12b is caught by the insertion trench 6b.

By rotating the lock unit 5, the position of the first protrusion 12b changes as illustrated in FIG. 10, and the first protrusion 12b comes out of the insertion trench 6b. In the unlocked state illustrated in FIG. 11, the first protrusion 12b completely comes out of the insertion trench 6b, and the cover 2 can be opened.

The motor drive device 1 according to the first embodiment is provided with a mechanism for preventing excessive rotation of the lock unit 5 and a mechanism for making it easy to recognize that the cover 2 is brought into the locked state or the unlocked state during the operation of the lock unit 5. These mechanisms will be described.

As illustrated in FIGS. 9 to 11, a wall portion 16 protruding from the back surface 2b is formed on the cover 2. In the wall portion 16, a rotation restricting portion 17 is formed. The rotation restricting portion 17 is formed with a height such that it enters a movement locus between the first protrusion 12b and the second protrusion 12c when the lock unit 5 is rotated. As illustrated in FIG. 9, when the cover 2 is in the locked state, the first protrusion 12b comes into contact with the rotation restricting portion 17 and is prevented from further rotating. Further, as illustrated in FIG. 11, when the cover 2 is in the unlocked state, the second protrusion 12c comes into contact with the rotation restricting portion 17 and is prevented from further rotating. In this manner, the rotation restricting portion 17 prevents the lock unit 5 from being excessively rotated. Thus, it is possible to prevent inadvertent change of the unlocked state and the locked state due to excessive rotation.

In the wall portion 16, an intervening wall 18 having a protruding height lower than the rotation restricting portion 17 described above is formed. The intervening wall 18 has a different protruding height from the back surface 2b depending on the location.

Figure 12:
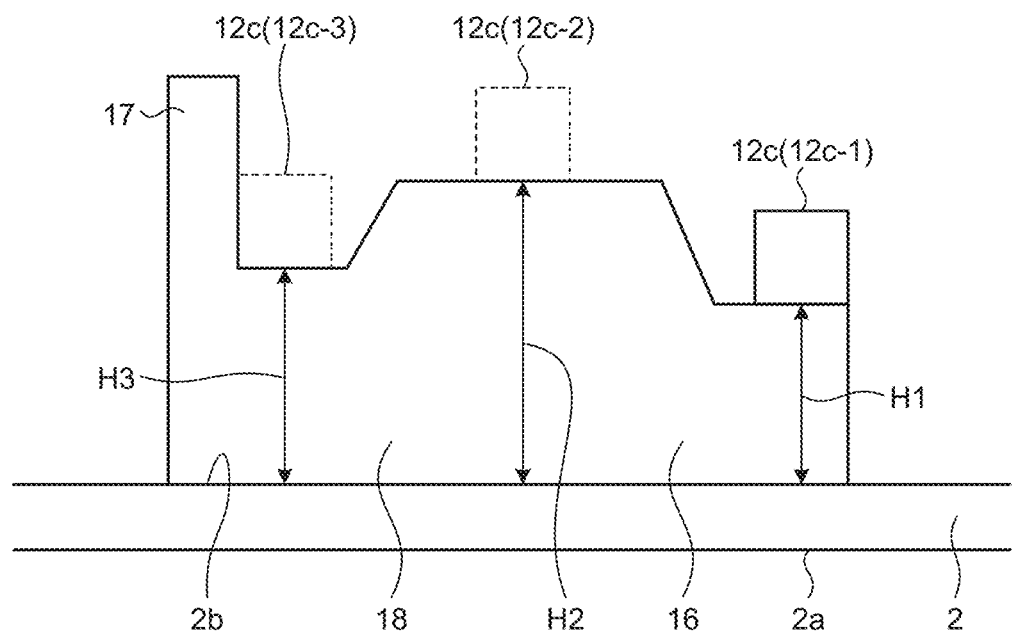
FIG. 12 is a diagram schematically illustrating a wall portion according to the first embodiment as viewed from a side surface.

FIG. 12 is a diagram schematically illustrating a wall portion according to the first embodiment as viewed from a side surface. In the intervening wall 18, a height H2 is higher than a height H1, where the height H2 is a height of a portion interposed between the second protrusion 12c (12c-2) and the back surface 2b of the cover 2 in the process of changing the state between the locked state and the unlocked state and the height H1 is a height of a portion interposed between the second protrusion 12c (12c-1) and the back surface 2b of the cover 2 in the locked state. Further, in the intervening wall 18, the height H2 is higher than a height H3 of a portion interposed between the second protrusion 12c (12c-3) and the back surface 2b of the cover 2 in the unlocked state. In addition, the portion having the height H1 and the portion having the height H2 are connected such that the height changes smoothly. Furthermore, the portion having the height H2 and the portion having the height H3 are connected such that the height changes smoothly. A protruding height of the intervening wall 18 is smaller than a protruding height of the rotation restricting portion 17 from the back surface 2b.

The height H1 and the height H3 are substantially equal to the distance between the second protrusion 12c and the back surface 2b in a state where the lock unit 5 is attached to the cover 2. The height H2 is larger than the distance between the second protrusion 12c and the back surface 2b in a state where the lock unit 5 is attached to the cover 2. In the process in which the state changes between the locked state and the unlocked state, the second protrusion 12c is pushed up to the portion having the height H2 of the intervening wall 18. Therefore, in the process in which the state changes between the locked state and the unlocked state, the intervening wall 18 is in contact with the second protrusion 12c from the cover 2 side, and a frictional force thereof causes a sense of resistance in rotating the lock unit 5. Thereafter, in the locked state or the unlocked state, the intervening wall 18 is lowered, so that the push-up from the intervening wall 18 to the second protrusion 12c is eliminated and the resistance felt when the lock unit 5 is rotated is also reduced. Since the resistance felt for rotating the lock unit 5 is reduced, the operator of the lock unit 5 can easily recognize that the cover 2 is brought into the locked state or the unlocked state.

In the first embodiment, an example in which the rotation restricting portion 17 and the intervening wall 18 are integrally formed has been described, but the rotation restricting portion and the intervening wall may be separately formed. For example, the wall portion 16 may not necessarily be provided, and the rotation restricting portion 17 and the intervening wall 18 may protrude from the back surface 2b of the cover 2. That is, it is sufficient if the second protrusion 12c rides over the intervening wall 18 in the process in which the lock unit 5 rotates and the state changes between the locked state and the unlocked state, and the second protrusion 12c descends from the intervening wall 18 at the positions of the locked state and the unlocked state.

Since the surrounding wall 14 surrounding the periphery of the trench 13 and protruding from the operation surface 11c is formed on the head portion 11a of the first member 11, it is difficult for an object other than a tool, such as a coin or a finger, to access the trench 13. Therefore, the lock unit 5 is not easily brought into the unlocked state except when the cover 2 needs to be opened, such as when an operation of connecting an electric wire to the terminal 7a is performed. Thus, it is possible to appropriately limit the opportunity to access the inside of the housing portion 6.

Figure 13:
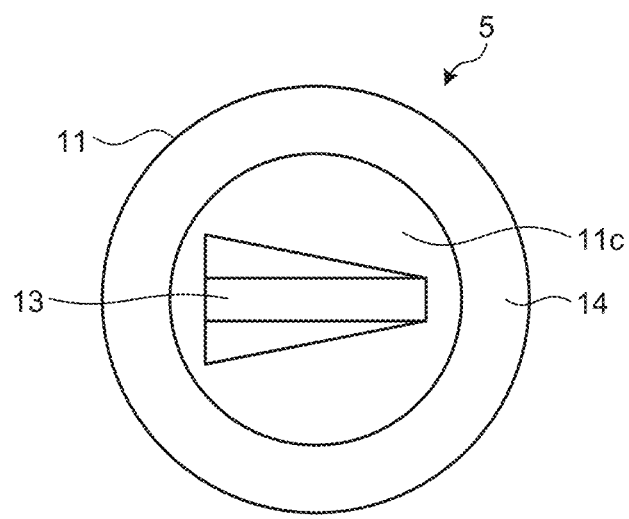
FIG. 13 is a diagram illustrating a first modification of the lock unit according to the first embodiment.

FIG. 13 is a diagram illustrating a first modification of the lock unit according to the first embodiment. On the operation surface 11c of the lock unit 5 according to the first modification, the trench 13 is formed in a shape narrowing from one side to the other side. Even with such a shape, the operator can recognize that the direction from the thicker side toward the thinner side is the direction in which the trench 13 points. In the example illustrated in FIG. 13, by making the depth of the triangular portion shallower than the depth of the rectangular portion into which the tool is inserted, the trench 13 can point in a specific direction while suppressing rattling between the tool and the trench 13 in the rectangular portion. That is, by forming a portion other than a portion to which the tool is fitted shallower than the portion to which the tool is fitted, it is possible to suppress rattling between the tool and the trench 13 and prevent deterioration in operability of the lock unit 5 while the entire trench 13 functions as a state indicator pointing in a specific direction.

Figure 14:
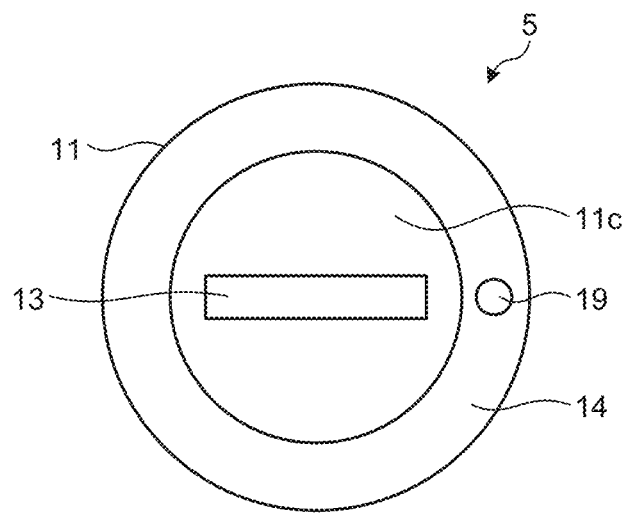
FIG. 14 is a diagram illustrating a second modification of the lock unit according to the first embodiment.

FIG. 14 is a diagram illustrating a second modification of the lock unit according to the first embodiment. In the lock unit 5 according to the second modification, a direction indication 19 pointing in a specific direction is provided at a position that is different from the trench 13 and moves with the rotation of the lock unit 5. In the example illustrated in FIG. 14, the direction indication 19 is indicated by a dot. Thus, when the direction indication 19 points in a specific direction, the locked state and the unlocked state can be easily determined even if the trench 13 does not point in the specific direction. In this case, the direction indication 19 is a state indicator that indicates whether the cover 2 is in the unlocked state or the locked state.

Figure 15:
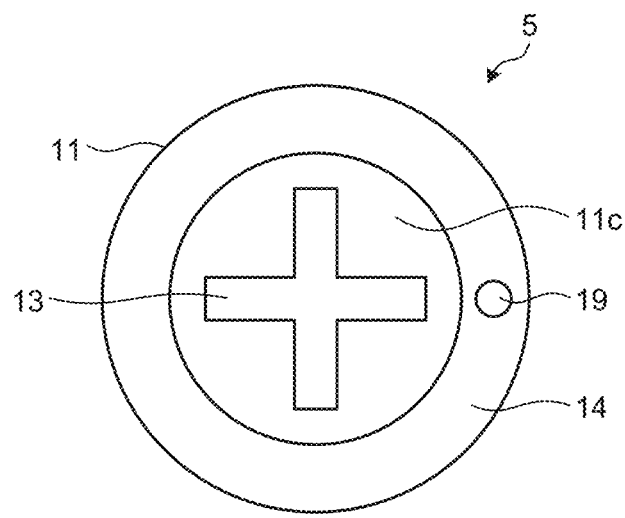
FIG. 15 is a diagram illustrating a third modification of the lock unit according to the first embodiment.

FIG. 15 is a diagram illustrating a third modification of the lock unit according to the first embodiment. In the lock unit 5 according to the third modification, a direction indication 19 is provided similarly to the second modification. Further, in the lock unit 5 according to the third modification, the trench 13 is formed in a shape into which a Phillips screwdriver is fitted. In such a manner, the shape of the trench 13 may be selected according to a tool assumed for the operation of the lock unit 5. In particular, in a case where the direction indication 19 is provided, it is not necessary that the trench 13 itself points in a specific direction, and thus it is possible to employ a free shape according to an assumed tool shape.

Figure 16:
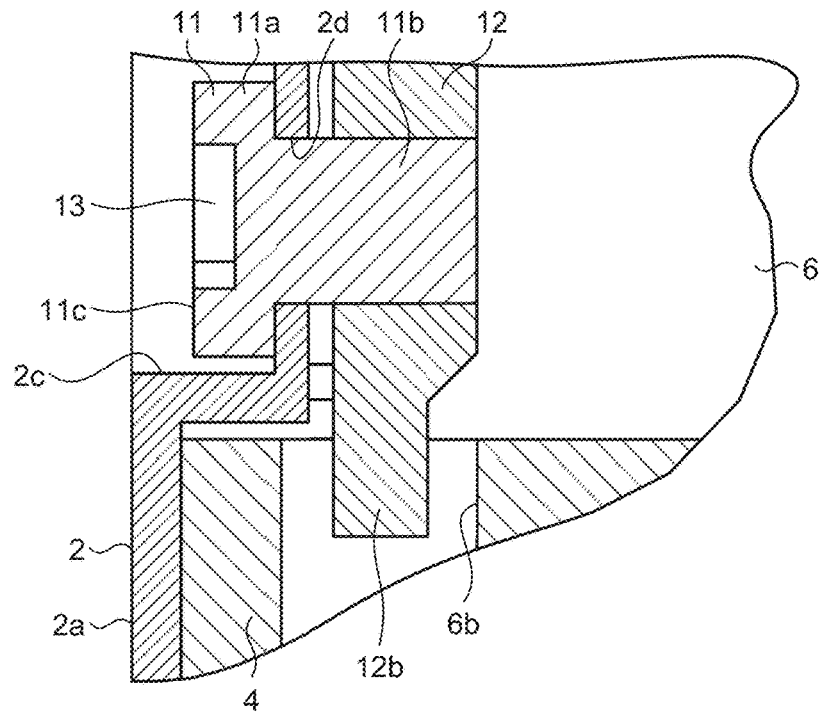
FIG. 16 is a diagram illustrating a fourth modification of the lock unit according to the first embodiment and is a diagram corresponding to the cross-sectional view illustrated in FIG. 7.

FIG. 16 is a diagram illustrating a fourth modification of the lock unit according to the first embodiment and is a diagram corresponding to the cross-sectional view illustrated in FIG. 7. In the lock unit 5 according to the fourth modification, the first member 11 itself is not formed with the surrounding wall that surrounds the trench 13 and protrudes from the operation surface 11c. However, by providing the operation surface 11c at a position recessed from the front surface 2a of the cover 2, the cover 2 exhibits a function as a surrounding wall. With such a configuration, it is possible to simplify the shape of the first member 11 and to make it difficult to operate the lock unit 5 with an object other than a tool, such as a coin or a finger.

Figure 17:
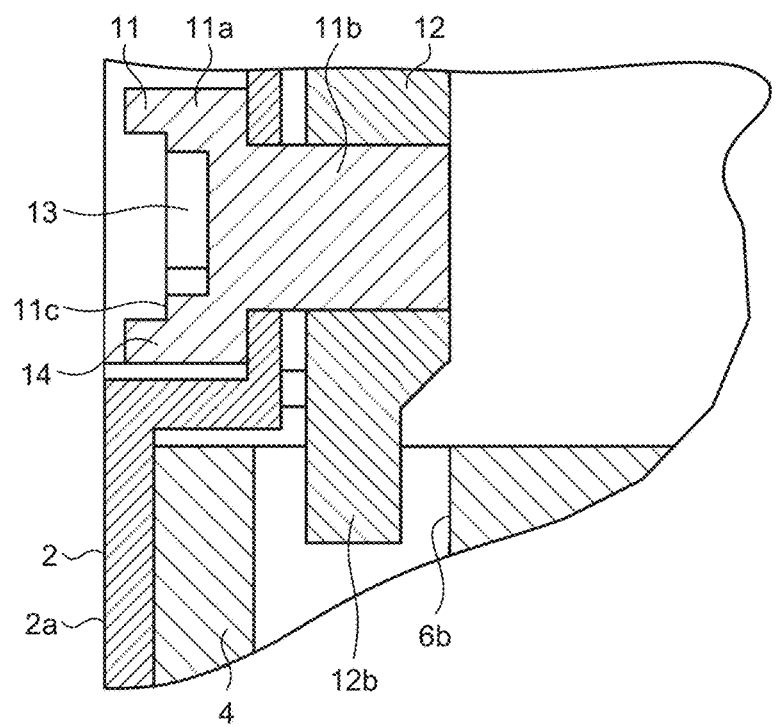
FIG. 17 is a diagram illustrating a fifth modification of the lock unit according to the first embodiment and is a diagram corresponding to the cross-sectional view illustrated in FIG. 7.

FIG. 17 is a diagram illustrating a fifth modification of the lock unit according to the first embodiment and is a diagram corresponding to the cross-sectional view illustrated in FIG. 7. In the lock unit 5 according to the fifth modification, the distal end of the surrounding wall 14 is provided at a position recessed from the front surface 2a of the cover 2. Thus, it is possible to further make it difficult to operate the lock unit 5 with an object other than a tool, such as a coin or a finger.

Figure 18:
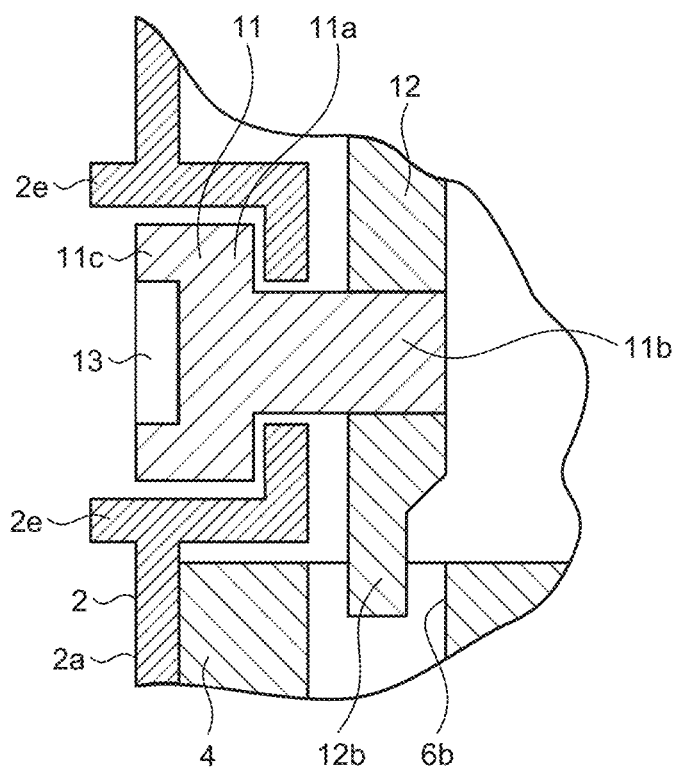
FIG. 18 is a diagram illustrating a sixth modification of the lock unit according to the first embodiment and is a diagram corresponding to the cross-sectional view illustrated in FIG. 7.

FIG. 18 is a diagram illustrating a sixth modification of the lock unit according to the first embodiment and is a diagram corresponding to the cross-sectional view illustrated in FIG. 7. In the lock unit 5 according to the sixth modification, a surrounding wall 2e surrounding the operation surface 11c is formed on the front surface 2a of the cover 2. With such a configuration, it is possible to simplify the shape of the first member 11 and to make it difficult to operate the lock unit 5 with an object other than a tool, such as a coin or a finger.

In the above-described embodiment, it has been described as an example that the locked state and the unlocked state of the cover 2 can be easily determined visually by the state indicator provided in the lock unit 5 pointing to the locking indication and the unlocking indication provided on the front surface 2a of the cover 2. However, it is possible to employ a configuration that allows easily determining the locked state and the unlocked state of the cover 2 by visual observation only by the state indicator provided in the lock unit 5. For example, it is possible to employ a configuration in which, when the lock unit 5 is rotated and the cover 2 is in the locked state, the state indicator emits light. Further, it is possible to employ a configuration in which, when the lock unit 5 is rotated and the cover 2 is in the locked state, the color of the state indicator changes. Even with such configurations, the locked state and the unlocked state of the cover 2 can be easily determined visually by the state indicator.

The configurations described in the above embodiments are examples, and can be combined with another known technique, and part of the configurations can be omitted or changed without departing from the gist.

REFERENCE SIGNS LIST 1 motor drive device; 2 cover; 2a front surface; 2b back surface; 2c hole; 2d through hole; 2e surrounding wall; 4 case; 4a first surface; 4b second surface; 4c detachable wall; 5 lock unit; 6 housing portion; 6a opening; 6b insertion trench; 7 terminal block; 7a terminal; 8, 9 rotation axis; 11 first member; 11a head portion; 11b shaft portion; 11c operation surface; 12 second member; 12a fitting hole; 12b first protrusion; 12c second protrusion; 13 trench; 14 surrounding wall; 15 indication portion; 16 wall portion; 17 rotation restricting portion; 18 intervening wall; 19 direction indication.

The invention claimed is:
1. A motor drive device comprising:
a case including a first surface and a housing portion that opens to the first surface side;
a terminal block including a terminal to which an electric wire extending to an outside of the case is connectable, the terminal block being housed in the housing portion;

a cover to cover the opening, the cover being provided to be openable and closable; and
a lock unit to restrict opening and closing of the cover and bring the cover into a locked state in a state where the cover is closed, wherein
the lock unit is provided on the cover so as to be rotatable about an axis perpendicular to the first surface in a state where the cover is closed,
an unlocked state in which the cover is openable and the locked state are switched according to a rotation angle of the lock unit,
the lock unit includes a state indicator to indicate that the cover is in the locked state,
the lock unit includes a back surface protruding portion protruding to a back surface of the cover facing the terminal block in a state where the cover is closed,
a first protrusion extending in a direction perpendicular to a direction from a front surface opposite to the back surface toward the back surface is formed on the back surface protruding portion,
an insertion trench into which the first protrusion is inserted when the cover is in the locked state and from which the first protrusion is removed when the cover is in the unlocked state is formed in the housing portion,
a rotation restricting portion protruding from the back surface is formed on the cover,
when the cover is changed from the unlocked state to the locked state, the first protrusion comes into contact with the rotation restricting portion and a rotation of the lock unit is restricted,
a second protrusion extending in a direction perpendicular to the direction from the front surface toward the back surface at a position different from the first protrusion is formed on the back surface protruding portion,
when the cover is changed from the locked state to the unlocked state, the second protrusion comes into contact with the rotation restricting portion and a rotation of the lock unit is restricted,
an intervening wall protruding from the back surface and having a protruding height lower than the rotation restricting portion is formed on the cover, and
the second protrusion rides over the intervening wall in a process in which the lock unit rotates to change a state between the locked state and the unlocked state, and the second protrusion descends from the intervening wall at positions of the locked state and the unlocked state.

2. The motor drive device according to claim 1, wherein
a locking indication to indicate the locked state is provided on a front surface of the cover opposite to a back surface facing the terminal block in a state where the cover is closed,
the lock unit is provided with an operation surface exposed to the front surface side,
the state indicator is a trench that is formed in the operation surface and that has a shape allowing insertion of a tool and pointing in a direction, and
in the lock unit, the direction in which the trench points in the locked state points to the locking indication.

3. The motor drive device according to claim 1, wherein
a locking indication to indicate the locked state is provided on a front surface of the cover opposite to a back surface facing the terminal block in a state where the cover is closed,
the lock unit is provided with an operation surface exposed to the front surface side,
a trench into which a tool is insertable is formed in the operation surface,
the state indicator is provided separately from the trench as a direction indication pointing in a direction at a position that moves in accordance with rotation of the lock unit, and
in the lock unit, the direction in which the direction indication points in the locked state points to the locking indication.

4. The motor drive device according to claim 2, wherein the lock unit includes a surrounding wall that surrounds the trench and protrudes from the operation surface.

5. The motor drive device according to claim 3, wherein the lock unit includes a surrounding wall that surrounds the trench and protrudes from the operation surface.

6. The motor drive device according to claim 1, wherein the intervening wall is interposed between the second protrusion and the back surface both in the locked state and in the unlocked state.

7. The motor drive device according to claim 2, wherein the intervening wall is interposed between the second protrusion and the back surface both in the locked state and in the unlocked state.

8. The motor drive device according to claim 3, wherein the intervening wall is interposed between the second protrusion and the back surface both in the locked state and in the unlocked state.

9. The motor drive device according to claim 4, wherein the intervening wall is interposed between the second protrusion and the back surface both in the locked state and in the unlocked state.

10. The motor drive device according to claim 5, wherein the intervening wall is interposed between the second protrusion and the back surface both in the locked state and in the unlocked state.

* * * * *